US012640729B2

(12) United States Patent
Kanale et al.

(10) Patent No.: US 12,640,729 B2
(45) Date of Patent: May 26, 2026

(54) OVERCURRENT PROTECTION METHOD FOR COMPOSITE POWER SEMICONDUCTOR SWITCHES

(71) Applicant: North Carolina State University, Raleigh, NC (US)

(72) Inventors: Ajit Kanale, Raleigh, NC (US); Suyash Sushilkumar Shah, Raleigh, NC (US); Bantval Jayant Baliga, Raleigh, NC (US); Subhashish Bhattacharya, Raleigh, NC (US)

(73) Assignee: NORTH CAROLINA STATE UNIVERSITY, Raleigh, NC (US)

( * ) Notice: Subject to any disclaimer, the term of this patent is extended or adjusted under 35 U.S.C. 154(b) by 147 days.

(21) Appl. No.: 18/535,753

(22) Filed: Dec. 11, 2023

(65) Prior Publication Data

US 2024/0195402 A1     Jun. 13, 2024

Related U.S. Application Data

(60) Provisional application No. 63/431,554, filed on Dec. 9, 2022.

(51) Int. Cl.
*H03K 17/082* (2006.01)

(52) U.S. Cl.
CPC ............................... *H03K 17/0828* (2013.01)

(58) Field of Classification Search
CPC ........................................ H03K 17/08–0828
See application file for complete search history.

(56) References Cited

U.S. PATENT DOCUMENTS

| | | | | |
|---|---|---|---|---|
| 9,190,993 B1* | 11/2015 | Li | ........................ | H03K 17/102 |
| 11,606,086 B2* | 3/2023 | Liu | ...................... | H02H 1/0007 |
| 2020/0228109 A1* | 7/2020 | Bachhuber | ......... | H03K 17/0828 |
| 2022/0407308 A1* | 12/2022 | Song | ................... | G01R 31/2621 |
| 2023/0033695 A1* | 2/2023 | Alvi | ................... | H03K 17/0822 |

FOREIGN PATENT DOCUMENTS

WO     WO-2020172031 A1 *   8/2020   ........... H10D 62/155

* cited by examiner

*Primary Examiner* — Thienvu V Tran
*Assistant Examiner* — Christopher J Clark
(74) *Attorney, Agent, or Firm* — Thomas | Horstemeyer, LLP

(57)     ABSTRACT

Various examples are provided related to overcurrent protection for composite power semiconductor switches comprising a high voltage power switch in series with a low voltage non-linear element. In one example, a system includes a blocking diode connected to a sensing node of a composite switching device; a resistor connected in series with the blocking diode and to a desaturation detection input of a gate driver circuit; and a blanking capacitor connected between the desaturation detection input and a common voltage reference of the gate driver circuit. The gate driver circuit can detect a short circuit condition based upon a sensed voltage at the desaturation detection input. In another example, a method includes sensing a voltage on a blanking capacitor, the voltage provided from a sensing node of a composite switching device via a blocking diode and a resistor, and detecting a short circuit condition based upon the sensed voltage.

20 Claims, 6 Drawing Sheets

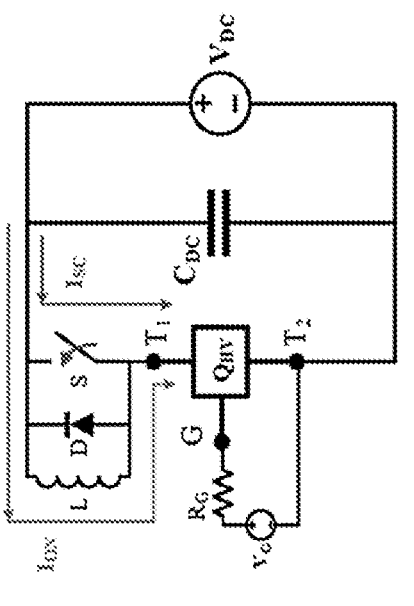

(a)

$V_{DC}$ = Constant DC Voltage Source $C_{DC}$ = DC Link Capacitor $Q_{HV}$ = High-Voltage Power Semiconductor Switch $T_1$ = Drain/Collector Terminal of $Q_{HV}$ $T_2$ = Source/Emitter Terminal of $Q_{HV}$ G = Terminal for Voltage Controlled Switching of $Q_{HV}$

FIG. 1A

(b)

$R_G$ = Gate Resistance to adjust switching speed of $Q_{HV}$ $V_G$ = Voltage Source to operate $Q_{HV}$ L = Load Inductor D = Freewheeling Diode S = Switch to represent short-circuit fault under load $I_{SC}$ = Current Path under SC fault $I_{ON}$ = Current Path under Normal Operating Conditions

FIG. 1B

OVERCURRENT PROTECTION METHOD FOR COMPOSITE POWER SEMICONDUCTOR SWITCHES

CROSS REFERENCE TO RELATED APPLICATIONS

This application claims priority to, and the benefit of, U.S. provisional application entitled "Overcurrent Protection Method for Composite Power Semiconductor Switches" having Ser. No. 63/431,554, filed Dec. 9, 2022, which is hereby incorporated by reference in its entirety.

STATEMENT REGARDING FEDERALLY SPONSORED RESEARCH OR DEVELOPMENT

This invention was made with government support under grant number DE-EE0008345 awarded by the U.S. Department of Energy. The government has certain rights in the invention.

BACKGROUND

Power electronic converter circuits are ubiquitous components of modern life. They convert electricity from one form (AC or DC) to another for use in a variety of applications. The central element in power electronic converters is the power switch—typically built using a combination of one or more power devices such as insulated gate bipolar transistors (IGBTs), power metal oxide semiconductor field effect transistors (MOSFETs), and power diodes. Presently, Si IGBTs and SiC power MOSFETs are the preferred choice of device for use as a power switches in most medium voltage and high voltage power converter circuits.

SUMMARY

Aspects of the present disclosure are related to overcurrent protection for composite power semiconductor switches. In one aspect, among others, a system for overcurrent protection comprises a blocking diode connected to a sensing node of a composite switching device, the sensing node coupled between a high voltage power switch and a low voltage nonlinear element of the composite switching device; a resistor connected in series with the blocking diode, the resistor connected to a desaturation detection input of a gate driver circuit of the composite switching device; and a blanking capacitor connected between the desaturation detection input and a common voltage reference of the gate driver circuit, wherein the gate driver circuit detects a short circuit condition based upon a sensed voltage at the desaturation detection input.

In one or more aspects, detection time of the short circuit condition can be based upon size of the blanking capacitor. Gating of the high voltage power switch is controlled based upon detection of the short circuit condition. The high voltage power switch can be a Silicon MOSFET, Silicon IGBT, Silicon Carbide MOSFET or Gallium Nitride HEMT device. The low voltage nonlinear element can be a Gate-Source-Shorted Silicon Depletion-Mode MOSFET or Silicon Enhancement-Mode MOSFET device. The common voltage reference of the gate driver circuit can be connected to a source of the composite switching device. The low voltage nonlinear element can be connected between the high voltage power switch and the source of the composite switching device. The composite switching device can be a bidirectional composite switching device. The bidirectional composite switching device can comprise a second high voltage power switch and a second low voltage nonlinear element. In various aspects, the system can comprise a second blocking diode connected to a second sensing node of the composite switching device, the second sensing node coupled between the second high voltage power switch and the second low voltage nonlinear element; a second resistor connected in series with the second blocking diode, the second resistor connected to a desaturation detection input of a second gate driver circuit; and second blanking capacitor connected between the desaturation detection input of the second gate driver circuit and a common voltage reference of the second gate driver circuit.

In another aspect, a method for overcurrent protection comprises sensing a voltage on a blanking capacitor, the voltage provided from a sensing node of a composite switching device via a blocking diode and a resistor, the sensing node coupled between a high voltage power switch and a low voltage nonlinear element of the composite switching device; and detecting a short circuit condition based upon the sensed voltage on the blanking capacitor. In one or more aspects, detection time of the short circuit condition can be based upon size of the blanking capacitor. The voltage can be sensed by a gate driver circuit. The blanking capacitor can be connected between a desaturation detection input of the gate driver circuit and a common voltage reference of the gate driver circuit, wherein the gate driver circuit can detect the short circuit condition based upon the sensed voltage at the desaturation detection input. Gating of the high voltage power switch can be controlled based upon detection of the short circuit condition. The common voltage reference of the gate driver circuit can be connected to a source of the composite switching device. The low voltage nonlinear element can be connected between the high voltage power switch and the source of the composite switching device.

In various aspects, the high voltage power switch can be a Silicon MOSFET, Silicon IGBT, Silicon Carbide MOSFET or Gallium Nitride HEMT device. The low voltage nonlinear element can be a Gate-Source-Shorted Silicon Depletion-Mode MOSFET or Silicon Enhancement-Mode MOSFET device. The composite switching device can be a bidirectional composite switching device. The bidirectional composite switching device can comprise a second high voltage power switch and a second low voltage nonlinear element. The method can comprise sensing a voltage on a second blanking capacitor, the voltage provided from a second sensing node of the bidirectional composite switching device via a second blocking diode and a second resistor, the second sensing node coupled between the second high voltage power switch and the second low voltage nonlinear element; and detecting a short circuit condition based upon the sensed voltage on the second blanking capacitor.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 1A and 1B illustrate examples of short circuit fault events seen with Power semiconductor switches, in accordance with various embodiments of the present disclosure.

DETAILED DESCRIPTION

Figure 2:
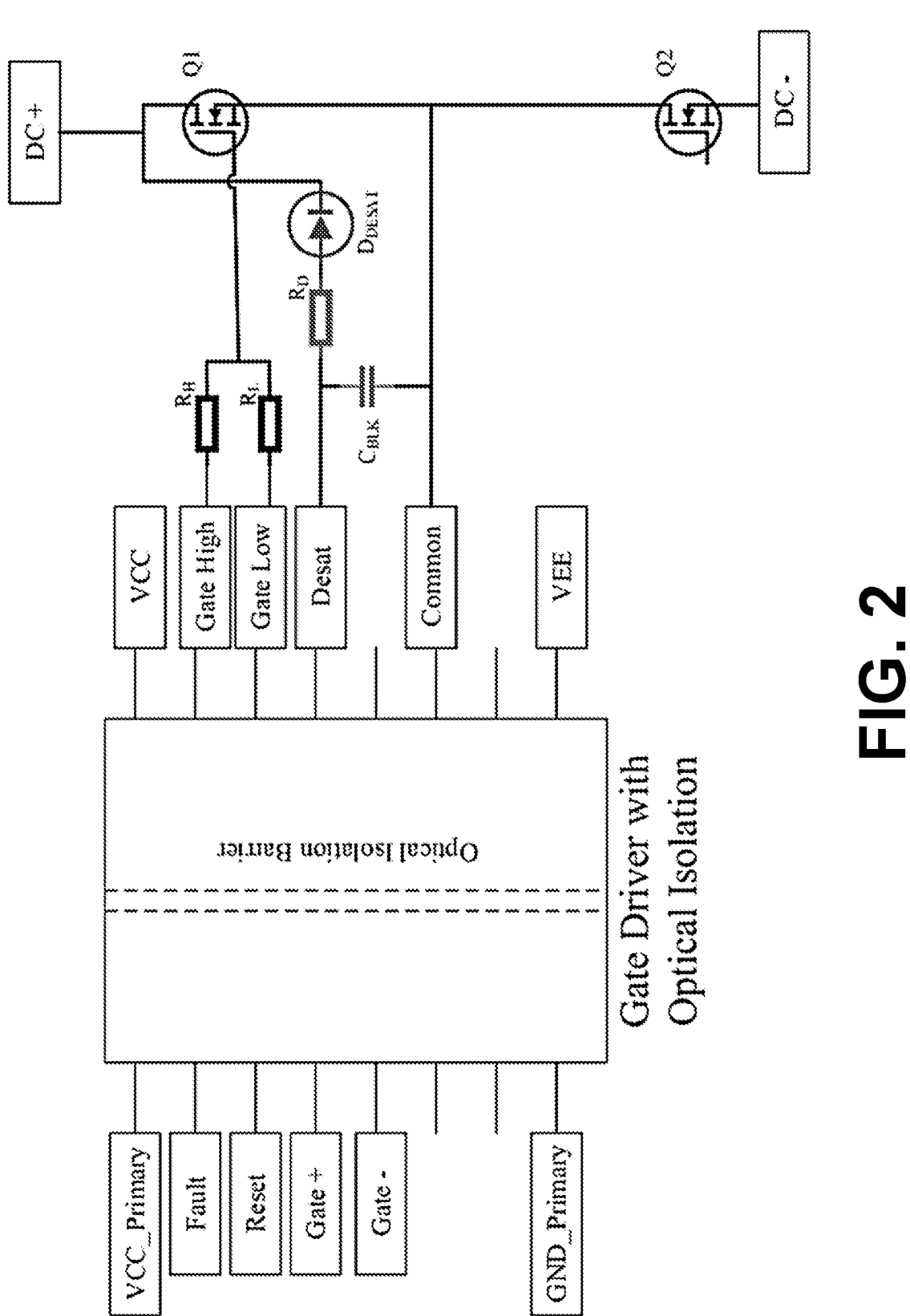
FIG. 2 is a schematic diagram illustrating an example of a Desat circuit, in accordance with various embodiments of the present disclosure.

Disclosed herein are various examples related to overcurrent protection for composite power semiconductor switches. Reference will now be made in detail to the description of the embodiments as illustrated in the drawings, wherein like reference numbers indicate like parts throughout the several views.

Existing Overcurrent Protection methods such as the Desat detection circuit require circuit board clearances. The absence of circuit board clearances can enable the realization of compact gate drivers for each power transistor in a converter. When considered at the system level, this can result in a significant reduction of system volume and increase power density. Additionally, the absence of clearance requirements can drive down system costs which may accelerate widespread adoption of wide bandgap power transistors for commercial applications.

This disclosure proposes a methodology to prevent overcurrent in composite power semiconductor switches during short-circuit faults using a fast detection circuit. It is applicable for switches designed in the Baliga Short-Circuit Improvement Concept (BaSIC) topology and harnesses the low voltage drop across a non-linear element connected in series with the power switch under short-circuit conditions to trigger a fault signal in the gate driver integrated circuit. The proposed methodology can be used for all the different implementations of the BaSIC topology for power semiconductor switches of different blocking voltage ratings. The proposed methodology can be applied to all power transistors used in power conversion systems such as AC-AC, AC-DC, DC-DC or DC-AC converter circuits.

The disclosed methodology can facilitate the design of power electronic solutions with enhanced short-circuit ruggedness compared to the state-of-the-art. This can enable the deployment of wide bandgap power transistors, which have poor short-circuit ruggedness, but superior efficiency, high frequency operation capability, high voltage ratings and high operating temperature capability compared to the state-of-the-art. This can result in widespread commercial acceptance of wide bandgap power switches in power conversion systems, leading to increased power density, greater system efficiency and enhanced system reliability compared to the state-of-the-art.

Under normal operating conditions, power switches block high-voltage, conducting negligible current, or conduct an arbitrary nominal operating current while having a low voltage drop (<4 V). Occasionally, due to faults arising within a converter system or triggered by external occurrences, power switches are simultaneously subject to supporting high voltage and conducting currents orders of magnitude larger than those seen under normal operation. These conditions are classified as short-circuit (SC) faults. Two kinds of SC faults are schematically illustrated in FIGS. 1A and 1B. FIG. 1A shows a hard-switched fault where the power semiconductor switch is turned on into a short-circuit condition and FIG. 1B shows a fault-under-load where a short-circuit occurs across a power semiconductor switch operating in its on-state. The power switch undergoes prohibitive heating due to SC power dissipation resulting in physical destruction unless it is turned off immediately. Catastrophic damage of power switches under SC conditions can be prevented by deploying over-current protection (OCP) circuits. A commonly used OCP solution is the Desaturation detection circuit, also known as the "Desat circuit" which comprises a desat diode, resistor, and a blanking capacitor. FIG. 2 is a schematic diagram illustrating an example of a desat circuit.

The desaturation detection circuit, also known as the desat circuit, is an OCP solution for power switches. The desat circuit is used along with a gate driver IC which has a desat detection feature. Under normal operating conditions, the desat Diode $D_{DESAT}$ IS forward (positively) biased, and the blanking capacitor ($C_{BLK}$) holds no charge. Under short-circuit conditions, the voltage drop across the power switch rises along with the current, eventually reverse biasing $D_{DESAT}$. When $D_{DESAT}$ enters reverse bias, the blanking capacitor is charged, and subsequently, the gate driver IC triggers a flag indicating detection of the short-circuit event.

With SiC Power MOSFETs, the Desat circuit is the most commonly used over-current protection (OCP). It comprises a diode (the Desat diode $D_{DESAT}$) and a blanking capacitor ($C_{BLK}$) connected in parallel across the SiC power MOSFET, as shown in FIG. 2, and can be implemented in accompaniment with a gate driver IC that supports DESAT detection. The Desat circuit is triggered when the voltage drop across the SiC Power MOSFET exceeds a fixed value, called the Desat detection voltage $V_{DESAT}$. Under normal operating conditions, the voltage drop across the SiC Power MOSFET is less than $V_{DESAT}$, and the current from the source $I_{DESAT}$ flows through the forward-biased desat diode as shown in FIG. 2.

Under short-circuit conditions, the voltage across the SiC Power MOSFET begins to rise and goes beyond $V_{DESAT}$, the Desat diode $D_{DESAT}$ becomes reverse biased, and the current from the source $I_{DESAT}$ is re-directed to the blanking capacitor $C_{BLK}$. When the blanking capacitor is fully charged, a fault flag is triggered by the gate driver IC indicating the detection of the SC event, and the gate drive is withheld until the fault is cleared using the reset pin of the gate drive.

However, the desat OCP circuits deployed to protect power switches from short-circuit faults have the following shortcomings:

High-voltage rated Desat Diode: The desat diode ($D_{DESAT}$ in FIG. 2) must be rated at the same level as the power switch. This imposes constraints on the gate driver circuit board layout as the traces leading to the diode's terminals must be spaced out to meet creepage and clearance requirements. Spaced out components on a printed circuit board (PCB) reduce system power density and can result in bulky converter setups. Furthermore, high-voltage rated components drive up the cost of a converter system, which can have multiple power switches, each requiring its own desat circuit.

Large Voltage Swing at sensing node: The desat OCP solution senses the voltage drop at the drain/collector terminal of the power switch—a node that undergoes voltage swings comparable to the DC bus voltage levels (1-7 kV). This requires the physical layout of the desat circuit to ensure sufficient isolation for all low voltage components, which is achieved at the expense of system power density. Additionally, the parasitic capacitance of the blocking diode can result in the spurious triggering of short-circuit fault protection.

The desat circuit has a detection time proportional to the charging time of the blanking capacitor, typically in excess of 2-3 µs. While this has been optimized for Si IGBTs, emerging wide bandgap power switches such as SiC and GaN power MOSFETs, that have SC withstand times less than 3 µs, cannot always be protected with this solution.

An over-current protection circuit methodology is presented that can address the above concerns and can be deployed for all voltage-controlled power switches.

Proposed Overcurrent Protection

Figure 3A:
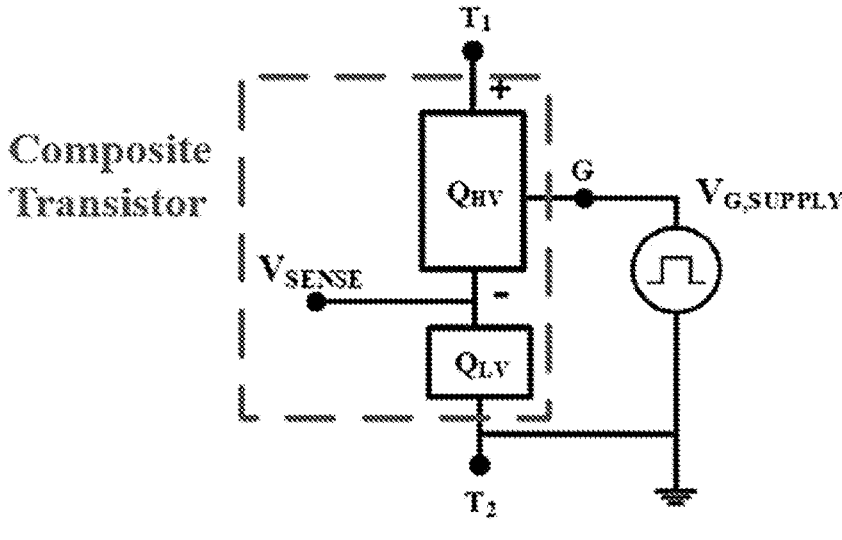
FIGS. 3A-3C are schematic diagrams illustrating examples of Baliga Short-circuit Improvement Concept (BaSIC) overcurrent protection (OCP), in accordance with various embodiments of the present disclosure.
Figure 3B:
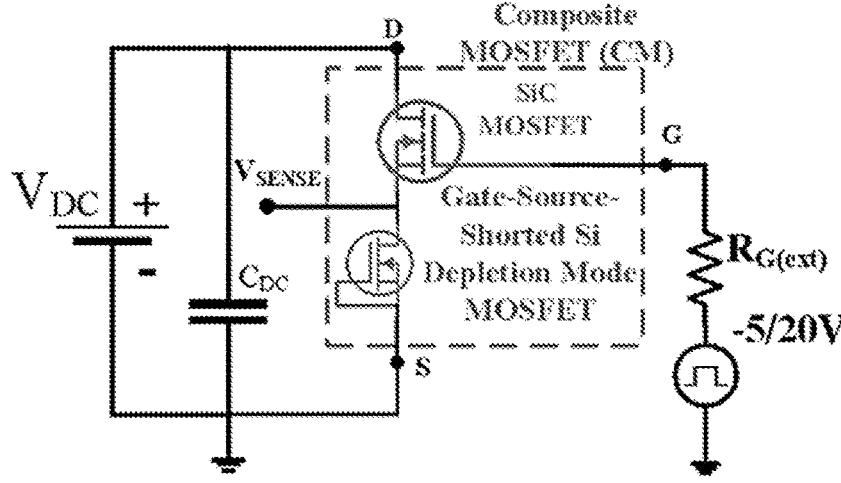
Figure 3C:
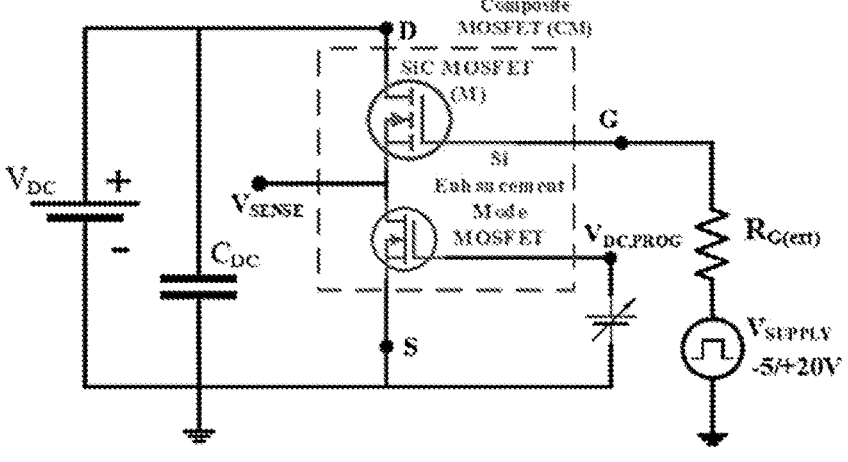

SiC power MOSFETs have a poor SC withstand time compared to Si IGBTs, which can be improved using the BaSIC topology. The BaSIC topology employs a low-voltage element in series with the high voltage power switch—typically a Silicon MOSFET, Silicon IGBT, Silicon Carbide MOSFET or Gallium Nitride HEMT device—which enters saturation mode under short-circuit conditions and suppresses the gate drive voltage appearing at the high-voltage power switch. An example of the BaSIC topology shown in FIG. 3A, along with two example implementations shown in FIGS. 3B and 3C, has been demonstrated to improve the SC withstand capability of high-voltage power switches while having minimal impact on normal operations. FIG. 3A illustrates a representative schematic diagram of the Baliga Short-circuit Improvement Concept (BaSIC) to realize a three-terminal Composite MOSFET structure along with a Sense node (VSENSE). FIG. 3B shows a representative schematic of the BaSIC(DMM) Topology implementation with a SiC power MOSFET as $Q_{HV}$ and a Gate-Source-Shorted Si Depletion Mode MOSFET as $Q_{LV}$ and FIG. 3C shows a representative schematic of the BaSIC(EMM) Topology implementation with a SiC power MOSFET as $Q_{HV}$ and a Si Enhancement Mode MOSFET as $Q_{LV}$.

The BaSIC topology is implemented as shown in FIG. 3A, with a low-voltage non-linear element $Q_{LV}$ connected in series with the high-voltage power switch $Q_{HV}$. Under normal operations, the low-voltage series element ($Q_{LV}$ in FIG. 3A) is in its on-state with low resistance and low-voltage drop (about 0.5 V) compared to the high-voltage power switch ($Q_{HV}$ in FIG. 3A), thereby having a low impact on the overall device on-resistance, transconductance, and switching performance. Under short-circuit conditions, $Q_{LV}$ enters its saturation region, and its voltage drop increases to about 8 V. This increase reduces the gate-source voltage appearing at $Q_{HV}$, consequently suppressing its saturation current until it matches that of $Q_{LV}$. The BaSIC Topology has been disclosed in U.S. Provisional Application entitled "Power Devices having Saturation Current Clamps therein that Support Improved Short-Circuit Capability" having Ser. No. 62/808,451, filed Feb. 21, 2019, and PCT Patent Application Publication No. WO 2020/172031, having serial no. PCT/US20/18027, filed Feb. 12, 2020, both of which are hereby incorporated by reference in their entireties.

Figure 4:
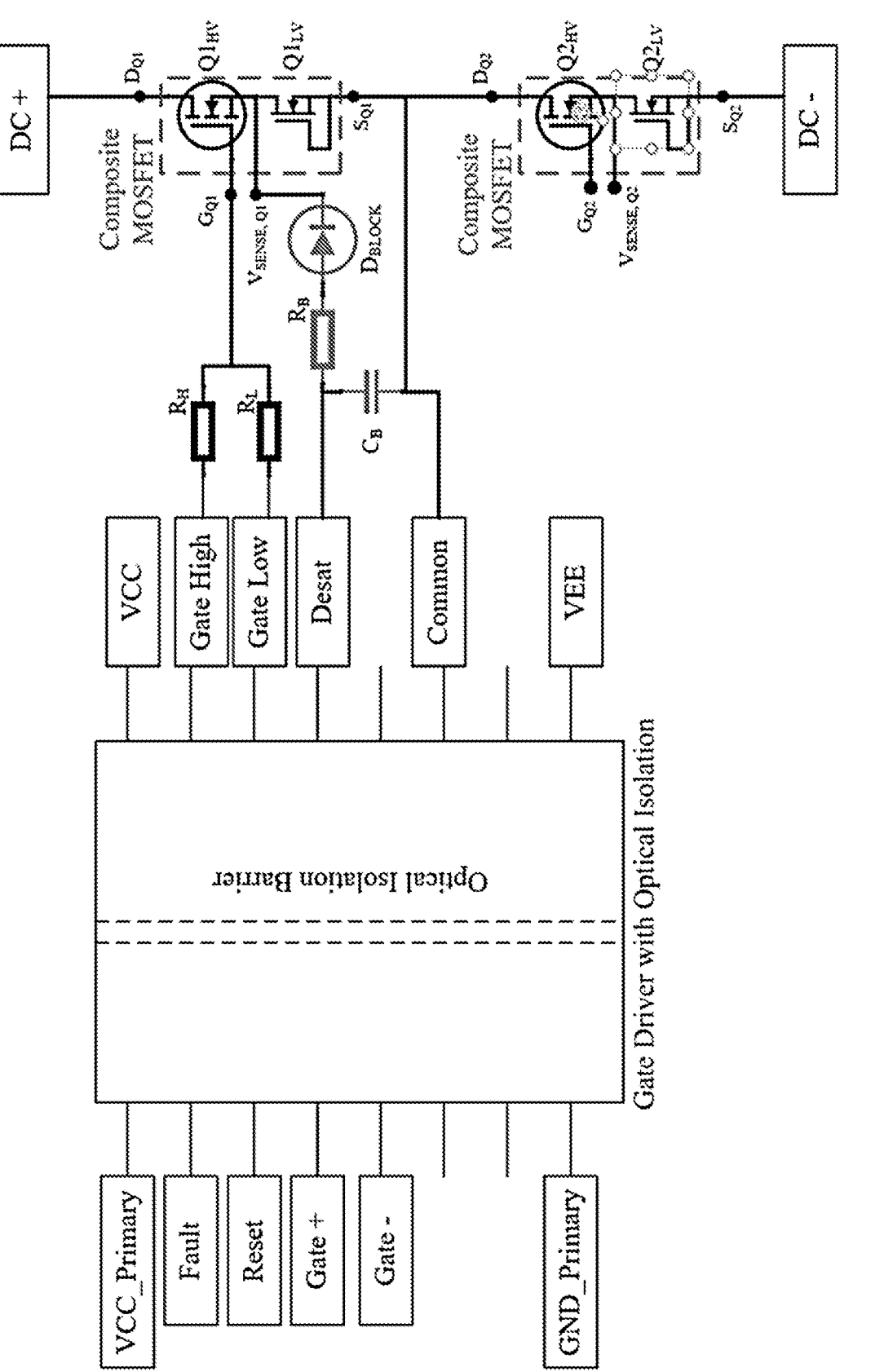
FIGS. 4 and 5 are schematic diagrams illustrating examples of BASIC OCP circuit implementations for composite MOSFETs in the BASIC(DMM) and BASIC(EMM) Topologies, respectively, in accordance with various embodiments of the present disclosure.
Figure 5:
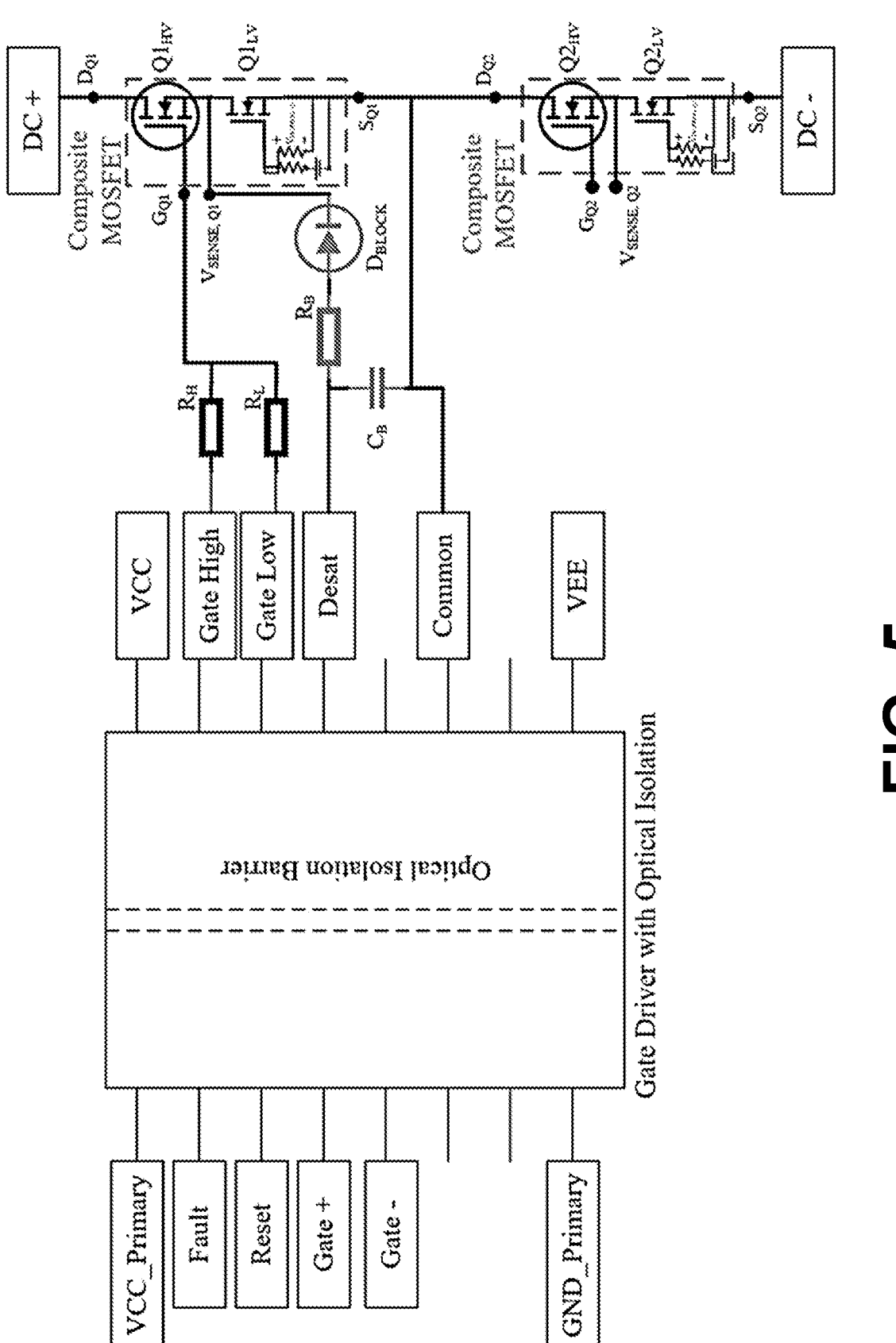
Figure 6:
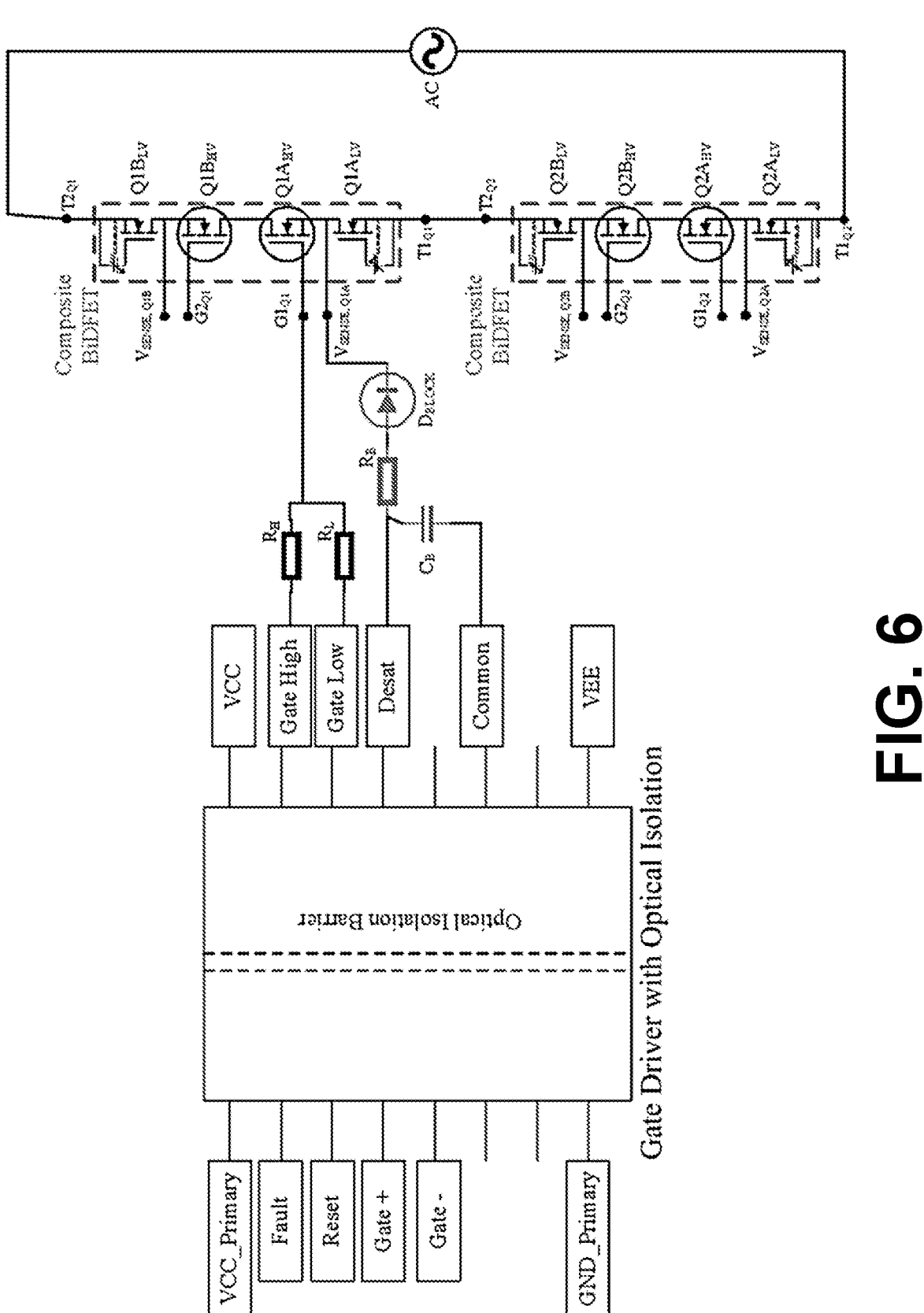
FIG. 6 is a schematic diagram illustrating an example of a BaSIC OCP circuit implementation for a composite BiD-FET, in accordance with various embodiments of the present disclosure.

FIGS. 4-6 show representative schematics of examples of the proposed solution, the BaSIC OCP circuit, for composite power semiconductor switches. FIGS. 4 and 5 illustrate BaSIC OCP circuit implementations for composite MOSFETs in the BaSIC(DMM) and BaSIC(EMM) Topologies, respectively. The half-bridge leg will utilize a similar implementation for the $G_{Q2}$ (two BaSIC OCP circuits per half-bridge). The solution employs a low voltage blocking diode $D_{BLOCK}$ connected at the Sense node of the composite MOSFET in series with a resistor $R_B$ to control the amount of current flowing to or from the gate driver IC. A blanking capacitor $C_B$ is connected between the desat detection pin and the common voltage reference of the gate driver IC. FIG. 6 illustrates the BaSIC OCP circuit implementation for one gate drive loop of a composite BiDFET. The AC-AC converter half-bridge leg will utilize a similar implementation for G2$_{Q1}$, G1$_{Q2}$, and G2$_{Q2}$ (four BaSIC OCP circuits per half-bridge).

The proposed solution offers a range of benefits over the state-of-the-art. The proposed solution uses a blocking diode at the drain of the low-voltage series element $Q_{LV}$ in the composite transistor created by the BaSIC topology to detect the occurrence of SC events. The drop across $Q_{LV}$ is less than 10 V and does not need the clearance constraints for PCB layouts such as the ones with traditional desat circuits. The absence of PCB layout clearance constraints for the blocking diode enables the use of components with smaller footprints, thereby enabling compact, inexpensive power converter system realization. This would be a significant benefit in the case of multi-stage power converters which use several power switches with one gate driver per switch. The detection of a SC fault is dependent on the low voltage element $Q_{LV}$ entering the saturation region, and not on the charging of the blanking capacitor $C_B$. Consequently, the capacitor can be sized to achieve fast detection times of <0.5 µs, which would be difficult in the case of conventional desat circuits.

As shown in FIG. 6, the proposed solution can also help bidirectional switches such as the BiDFET, which need desat circuits for both first-quadrant and third-quadrant operation (2 desat circuits per switch). Reducing the area taken up by protection circuits would increase the power density of single-stage AC-AC power conversion systems using bidirectional switches such as the BiDFET.

The proposed solution can also ensure the safety of wide bandgap power switches such as SiC and GaN power MOSFETs being used in consumer applications such as electric vehicles and photovoltaic energy conversion systems. The proposed solution is independent of the voltage rating of the high-voltage power switch, thereby providing a compact, economic over-current protection option for power converters of various DC bus ratings. The proposed solution also works with both hard-switched short-circuit events as well as fault-under-load short-circuit events, thus simplifying OCP design considerations for switches in power converter applications.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

The term "substantially" is meant to permit deviations from the descriptive term that don't negatively impact the intended purpose. Descriptive terms are implicitly understood to be modified by the word substantially, even if the term is not explicitly modified by the word substantially.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A system for overcurrent protection, comprising:
a blocking diode directly connected to a sensing node of a composite switching device, the sensing node coupled between a high voltage power switch and a low voltage nonlinear element of the composite switching device;
a resistor connected in series with the blocking diode, the resistor connected to a desaturation detection input of a gate driver circuit of the composite switching device; and
a blanking capacitor connected between the desaturation detection input and a common voltage reference of the gate driver circuit, wherein the gate driver circuit detects a short circuit condition based upon a sensed voltage at the desaturation detection input.

2. The system of claim 1, wherein detection time of the short circuit condition is based upon size of the blanking capacitor.

3. The system of claim 1, wherein gating of the high voltage power switch is controlled based upon detection of the short circuit condition.

4. The system of claim 1, wherein the high voltage power switch is a Silicon MOSFET, Silicon IGBT, Silicon Carbide MOSFET or Gallium Nitride HEMT device.

5. The system of claim 1, wherein the common voltage reference of the gate driver circuit is connected to a source of the composite switching device.

6. The system of claim 5, wherein the low voltage nonlinear element is connected between the high voltage power switch and the source of the composite switching device.

7. The system of claim 1, wherein the composite switching device is a bidirectional composite switching device.

8. The system of claim 7, wherein the bidirectional composite switching device comprises a second high voltage power switch and a second low voltage nonlinear element.

9. The system of claim 8, further comprising:
a second blocking diode directly connected to a second sensing node of the composite switching device, the second sensing node coupled between the second high voltage power switch and the second low voltage nonlinear element;
a second resistor connected in series with the second blocking diode, the second resistor connected to a desaturation detection input of a second gate driver circuit; and
a second blanking capacitor connected between the desaturation detection input of the second gate driver circuit and a common voltage reference of the second gate driver circuit.

10. A method for overcurrent protection, comprising:
sensing a voltage on a blanking capacitor, the voltage provided from a sensing node of a composite switching device via a blocking diode and a resistor, the sensing node coupled between a high voltage power switch and a low voltage nonlinear element of the composite switching device; and
detecting a short circuit condition based upon the sensed voltage on the blanking capacitor.

11. The method of claim 10, wherein detection time of the short circuit condition is based upon size of the blanking capacitor.

12. The method of claim 10, wherein the voltage is sensed by a gate driver circuit.

13. The method of claim 12, wherein the blanking capacitor is connected between a desaturation detection input of the gate driver circuit and a common voltage reference of the gate driver circuit, wherein the gate driver circuit detects the short circuit condition based upon the sensed voltage at the desaturation detection input.

14. The method of claim 12, wherein gating of the high voltage power switch is controlled based upon detection of the short circuit condition.

15. The method of claim 14, wherein the common voltage reference of the gate driver circuit is connected to a source of the composite switching device.

16. The method of claim 15, wherein the low voltage nonlinear element is connected between the high voltage power switch and the source of the composite switching device.

17. The method of claim 10, wherein the high voltage power switch is a Silicon MOSFET, Silicon IGBT, Silicon Carbide MOSFET or Gallium Nitride HEMT device.

18. The method of claim 10, wherein the composite switching device is a bidirectional composite switching device.

19. The method of claim 18, wherein the bidirectional composite switching device comprises a second high voltage power switch and a second low voltage nonlinear element.

20. The method of claim 19, further comprising:
sensing a voltage on a second blanking capacitor, the voltage provided from a second sensing node of the bidirectional composite switching device via a second blocking diode and a second resistor, the second sensing node coupled between the second high voltage power switch and the second low voltage nonlinear element; and
detecting a short circuit condition based upon the sensed voltage on the second blanking capacitor.

* * * * *